US006927632B2

United States Patent
Sjursen et al.

(10) Patent No.: US 6,927,632 B2
(45) Date of Patent: Aug. 9, 2005

(54) LOW DISTORTION COMPRESSION AMPLIFIER

(75) Inventors: Walter Paul Sjursen, Washington Crossing, PA (US); Daramana G. Gata, Plano, TX (US); John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 385 days.

(21) Appl. No.: 10/176,381

(22) Filed: Jun. 20, 2002

(65) Prior Publication Data

US 2004/0000950 A1 Jan. 1, 2004

Related U.S. Application Data

(60) Provisional application No. 60/299,608, filed on Jun. 20, 2001.

(51) Int. Cl.[7] .................................................. H03G 3/30
(52) U.S. Cl. ........................................ 330/279; 330/281
(58) Field of Search ................................ 330/129, 141, 330/278, 279, 281

(56) References Cited

U.S. PATENT DOCUMENTS 4,360,787 A * 11/1982 Galpin ........................ 330/284

| 5,404,115 | A | 4/1995 | Johnson |
| 5,862,238 | A | 1/1999 | Agnew et al. |
| 5,903,655 | A | 5/1999 | Salmi et al. |
| 6,256,395 | B1 | 7/2001 | Melanson |

OTHER PUBLICATIONS

"FETs As Voltage–Controlled Resistors", AN105, *Sillconix*, Mar. 10, 1997, 6 pgs.

* cited by examiner

*Primary Examiner*—Steven J. Mottola
(74) *Attorney, Agent, or Firm*—W. Daniel Swayze, Jr.; W. James Brady; Frederick J. Telecky, Jr.

(57) ABSTRACT

A low distortion compression amplifier comprising an amplifier circuit having an input and an output, wherein an input signal is received at the input and amplified in accordance with a gain to form an output signal at the output. The amplifier circuit further comprises a comparator circuit operable to receive the output signal and generate a first control signal in response thereto. A digital gain control circuit is coupled to the amplifier circuit, and is operable to generate a digital gain control signal based at least in part on the first control signal. The gain control signal is then employed to modulate the gain of the amplifier circuit in a digital fashion. The invention also comprises a method of digitally controlling a gain associated with an amplifier circuit. The method comprises comparing an output signal to a threshold and modulating the gain in a digital fashion, wherein the gain is modulated up in a plurality of rates or down in a plurality of rates in response to the comparison.

26 Claims, 9 Drawing Sheets

LOW DISTORTION COMPRESSION AMPLIFIER

REFERENCE TO RELATED APPLICATIONS

This application claims priority to Provisional Application No. 60/299,608, filed Jun. 20, 2001 now abandoned, the entire teachings of which are incorporated herein by reference.

FIELD OF INVENTION

The present invention relates generally to electrical circuits and more particularly to a circuit and method for amplifying a signal having a low distortion associated therewith.

BACKGROUND OF THE INVENTION

The audible range of many hearing impaired individuals is compressed to a limited dynamic range of sound. For such individuals, soft sounds may be inaudible while loud sounds are heard at the same sound level as persons with normal hearing. Hearing aids are electronic devices which are often used to help individuals with hearing impairment lead a relatively normal life. Such hearing aids sometimes employ automatic gain control (AGC) circuitry to compensate for these hearing deficiencies. Such circuits are often designed to compress the sound level delivered to their users by providing greater amplifier gain for soft sounds and reduced gain for loud sounds.

AGC circuits are used because traditional amplifiers many times are unable to accurately reproduce an input signal because of limitations in the amplifier performance capabilities. Consequently, there may be magnitudes or values of the input signal that cannot be amplified properly. In such situations, a significant amount of distortion is generated at the amplifier output, and the output signal is "clipped" when the peak values of that signal are forced by the amplifier to not exceed some internally determined clipping limit.

AGC circuits are therefore employed to compress the output signal by reducing the gain of the amplifier whenever the output signal becomes too great. Such a circuit arrangement advantageously avoids much of the distortion that occurs due to clipping. The rapidity at which an AGC circuit reacts to the occurrence of unusually large signal magnitudes at the amplifier output, both the time duration in which gain changes are initiated and the duration in which gain changes are terminated, can cause different effects in the subsequent signal portions. Quick implementation of gain changes allows affecting the spoken syllables in an audio signal while slow implementation of gain changes allows the system to respond to the sound background to thereby control an average of the magnitude, or the loudness, of an audio output signal.

Quick response is needed in an automatic gain control system if moments of excessive magnitude in the output signal are to be addressed adequately (e.g., a transient such as a door slamming shut), and yet relatively slow gain changes are needed to suppress elevated levels of background noise in the audio output signal. Differing times of termination of gain changes can lead to the introduction of unwanted audio artifacts into the output signal. An AGC that responds both quickly and slowly to the need for gain changes to prevent sudden loudness increases and suppresses background noise can often provide an improved audio output signal for a listener.

The response time of an AGC circuit is commonly characterized by two parameters, the attack and release time. The attack and release times may be defined differently for different industries. For the hearing aid industry, the attack time is the time between the input signal's abrupt increase in level from 55 dBSPL to 90 dBSPL and the point where the output level has stabilized to within 3 dB of the steady value for the 90 dBSPL input sound pressure level (SPL). The release time is the interval between the input signal's abrupt drop from 90 dBSPL to 55 dBSPL and the point where the signal has stabilized to within 4 dB of the steady state value for the 55 dBSPL input sound pressure level (see, e.g., ANSI S3.22-1996, "Specification of Hearing Aid Characteristics").

As alluded to above, a common problem with AGC circuits employed in hearing aid compression systems is that no single choice of attack and release time adequately compensates for all signals. For instance, a circuit with both a fast attack and release time frequently causes audible "pumping" of the input signal. Conversely, too long a release time will produce audible gaps, especially if the input signal contains short transients resulting in long periods of reduced gain. Attack and release times of 10 ms and 200 ms, respectively, have been used in prior art hearing aids to minimize audible pumping of the input signal. Therefore there is a need in the art for a compression amplifier circuit that adequately addresses the above concerns.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a digitally controlled compression amplifier circuit. In contrast to conventional compression amplifiers which employ analog control and suffer the performance and size limitations associated therewith, the present invention utilizes digital control to generate multiple gain modulation rates or time constants based on different input conditions. Therefore the present invention advantageously provides differing attack and release times based on the input signal conditions, wherein such differing attack and release times are functions of the digital control and thus are well-defined, accurate and consistent with respect to time and from circuit to circuit.

In accordance with one aspect of the present invention, a digitally controlled compression amplifier circuit comprises an amplifier circuit which receives an input signal and generates an output signal which is an amplified version of the input signal based on a gain associated therewith. The compression amplifier circuit further comprises a comparator circuit which is operable to receive the output signal and generate a first control signal in response thereto. A digital gain control circuit receives the first control signal and generates a gain control signal based at least in part thereon, wherein the gain control signal is operable to modulate the gain of the amplifier circuit in a digital fashion.

In accordance with another aspect of the present invention, the digital gain control circuit further comprises first and second digital gain modulation circuits. The first modulation circuit is operable to generate a first gain control signal for modulating the gain down (comprising an attack time) at a first rate or up (comprising a release time) at a second rate, both in a digital fashion. The second modulation circuit is operable to generate a second gain control signal for modulating the gain down at a third rate and up at a fourth rate. Together, the first and second digital gain modulation circuits operate to generate differing attack and release times for use in differing input signal conditions. The digital gain control circuit further comprises a selection circuit that is operable to select one of the first and second digital control signals for modulation of the digitally controlled amplifier based on a predetermined criteria.

In accordance with yet another aspect of the present invention, the first and second gain modulation circuits comprise shift registers that each are operable to shift digital data of a first state in to the right at one frequency (corresponding to an attack time) when the gain of the amplifier circuit is too high, and shift digital data of a second state in to the left at another frequency (corresponding to a release time) when the gain of the amplifier circuit is too low. Various types of logic circuits may then be employed in conjunction with the shift registers to select digital word outputs associated therewith based on the predetermined criteria in order to modulate the gain of the digitally controlled amplifier. Based on which digital word shift register output is selected, unique attack or release times (or the rate at which the gain is modulated down or up) are employed in the gain control signal.

In accordance with still another aspect of the present invention, a method of digitally controlling a compression amplifier circuit is disclosed. The method comprises receiving an input signal and amplifying the input signal with an initial gain to generate an output signal. The output signal is compared to a threshold value, and a first control signal is generated in response thereto. When the output signal exceeds the threshold value, the first control signal enables a first shift register to begin shifting digital data of a first state in to the right at a first clock frequency that reflects a first attack time. A second shift register is enabled by the shifting of the first shift register, and begins shifting digital data of the first state in to the right at a third clock frequency the reflects a second attack time. Based on circuit conditions one of the digital word outputs of the first and second shift registers are employed to decrease the gain (at one of two differing modulation rates).

Similarly, when the output signal falls below the threshold (or a different threshold), the shift registers may begin shifting digital data of a second state in to the left, each at differing rates (based, for example, on a second and fourth clock frequencies that reflect different release times). Again, based on circuit conditions, one of the digital word outputs of the first and second shift registers are utilized to increase the gain (at one of two differing modulation rates).

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
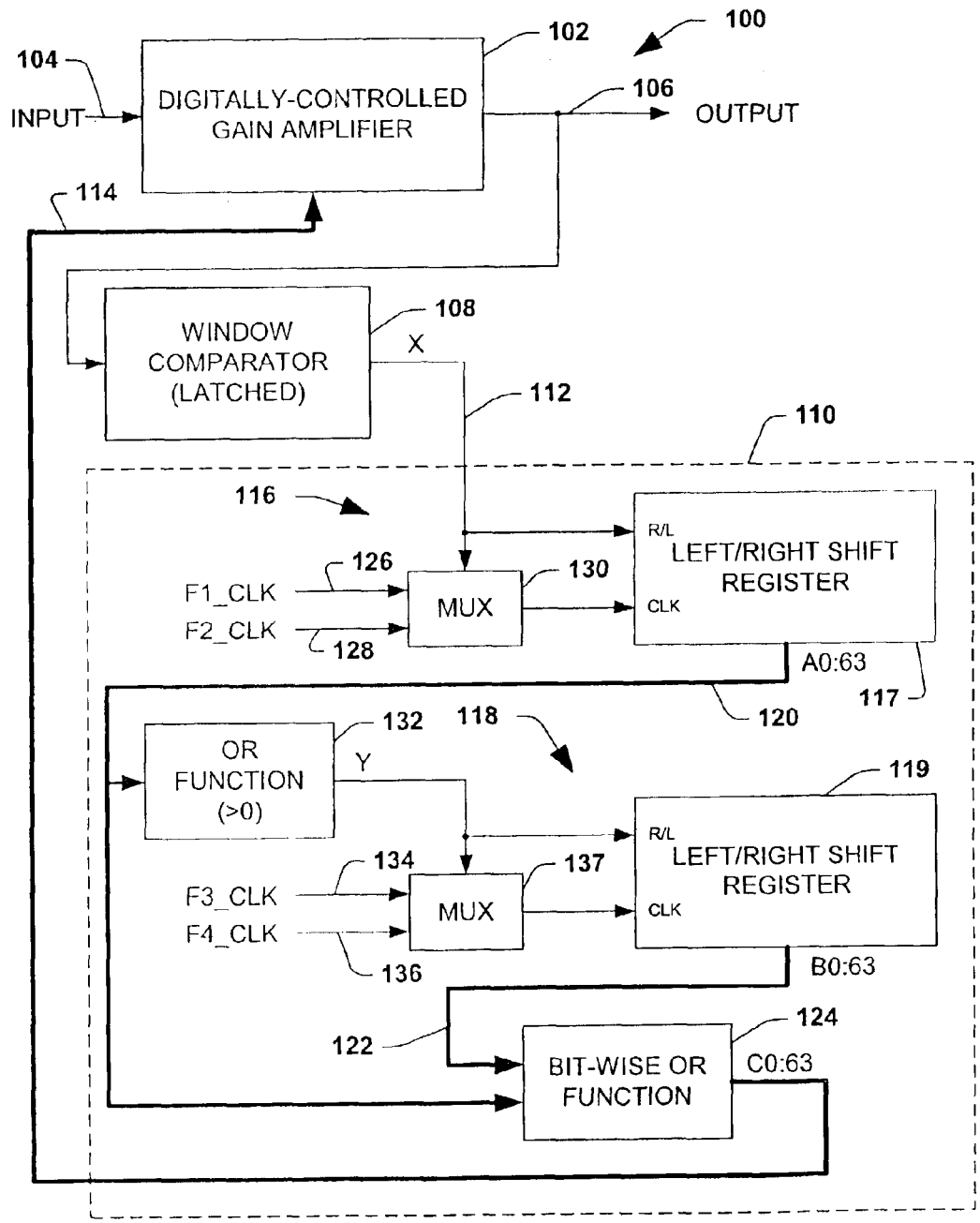
FIG. 1 is a block diagram illustrating a digitally-controlled compression amplifier circuit according to one exemplary aspect of the present invention.

The present invention will now be described with reference to the attached drawings, wherein like reference numerals are used to refer to like elements throughout. In one aspect of the invention, a hearing aid device involves processing an audio input signal. This input signal is fed into a digital gain adjusting circuit so that the audio signal is not clipped by the electronic limitations of an input amplifier circuit. For example, a loud audio input signal can be compressed so that the audio signal is not over-amplified or distorted. Such performance is achieved by sensing the amplitude of the audio signal and adjusting the gain of a corresponding amplifier circuit in a digital manner so that the audio signal is not clipped at an output of an amplifier stage.

Turning now to the figures, FIG. 1 is a block diagram illustrating a low distortion compression amplifier circuit 100 according to one exemplary aspect of the present invention. The amplifier circuit 100, as will be described in greater detail below, provides a digital control of a gain thereof and advantageously provides for multiple, differing attack and release times based on predetermined criteria. The amplifier circuit 100 includes a digitally controlled gain amplifier circuit 102 having an input 104 and an output 106 associated therewith. The amplifier circuit 100 further comprises a comparator circuit 108 and a digital gain control circuit 110.

The comparator circuit 108 receives, in one example, an output signal at the output 106 and generates a first control signal 112 ("X") in response thereto. For example, when the output signal exceeds a predetermined potential, the comparator circuit 108 "trips" or changes state, and the first control signal 112 indicates to the digital gain control circuit 110 that gain modulation is needed. The digital gain control circuit 110 then generates a gain control signal 114, for example, a digital, multi-bit word, to modulate the gain associated with the digitally-controlled gain amplifier 102 accordingly (e.g., by reducing the gain associated therewith).

In accordance with one exemplary aspect of the invention, the digital gain control circuit 110 comprises first and second gain modulation circuits 116 and 118, respectively. The first and second gain modulation circuits 116, 118 are operable to modulate the gain via the gain control signal 114 at a plurality of different rates in a digital fashion. For example, the first gain modulation circuit 116 (e.g., including a first shift register 117) is operable to generate a first gain control signal 120 to decrease the gain at a first rate and increase the gain at a second rate, while the second gain modulation circuit 118 (e.g., including a second shift register 119) is operable to generate a second gain control signal 122 to decrease the gain at a third rate and increase the gain at a fourth rate, respectively. The gain control circuit 110 further comprises a selection circuit 124 that is operable to select one of the gain control signals 120, 122 based on predetermined criteria. Therefore the digital gain control circuit 110 is operable to provide digital control for multiple, differing attack and release times based on differing circumstances.

Referring to FIG. 1 in greater detail in accordance with one example, the output of the gain amplifier 102 is sensed by a window comparator 108. If the output voltage exceeds a desired limit, the output 112 of the comparator ("X") goes to one state (e.g., a logic 1), otherwise the output is a second state (e.g., a logic 0). In the present example, the output is latched to ensure proper setup and hold times with the rest of the circuit.

To understand the circuit operation in the present example, consider the function of the first shift register 117. The output 112 of the comparator 108 controls the shifting direction of the shift register (e.g., to the left or to the right). The first shift register 117 provides the fast attack and release times needed for transient signals via the clock signals 126 (F1_CLK) and 128 (F2_CLK), respectively. Assume that the output of the shift register 117 starts with all logic 0s, and all analog switches (to be discussed infra) in the feedback path of the gain-controlled amplifier are off. At this point, the gain-controlled amplifier 102 is at maximum gain. As the output signal exceeds the predetermined limit of the comparator 108, the output 112 goes to a logic 1 and the "fast" shift register 117 starts shifting logic 1s in a first direction (e.g., in to the right).

As the logic 1s are shifted in to the right, the gain of the amplifier 102 can be reduced (e.g., by 0.5 dB for each 1 shifted in). Also, at this point a multiplexer 130 associated with the first gain modulation circuit 116 which acts to select the appropriate clock signal 126, 128 to the register 117, selects the F1_CLK (~160 kHz). This exemplary clock frequency sets the maximum attack time. The maximum attack time in this example is 64/160 kHz=0.4 ms although other values may also be employed and such variations are contemplated as falling within the scope of the present invention. As the gain of the amplifier 102 is reduced, the output 106 is reduced until it is within the limits of the window comparator 108. The direction of the shift register 117 is then changed by the first control signal 112 and logic 0s are shifted in a second direction (e.g., in to the left of register 117). As the logic 0s shift towards the left, the gain of the amplifier 102 is increased (e.g., by 0.5 dB increments). The multiplexer 130 selects a slower clock F2_CLK (1.25 kHz) for the release operation (which represents the "fast" release operation) based on the first control signal 112. The maximum release time in the present example is given by 64/1250 Hz=51.2 ms.

Whenever the output 120 of the first shift register (e.g., the first gain control signal, A0:63) contains at least one logic 1, the second shift register 119 will shift logic 1s in to the right. When A0:63 are all logic 0s, the second shift register will shift logic 0s in to the left. Such functionality is provided in the present example by a first logic circuit 132 (e.g., an OR function). For example, the circuit 132 may comprise a 64-input OR gate which detects if any bits of the signal 120 (which may comprise a digital, multi-bit word, A0:63) are a logic 1.

The operation of the second shift register 119 is similar to the first shift register 117 described above. However the clock frequencies 134 and 136 (F3_CLK and F4_CLK) used for the attack and release times are quite different, for example, F3_CLK is 312.5 Hz and F4_CLK is 39.0625 Hz. Note that in the present example all clock frequencies are binary fractions of the highest clock frequency (160 kHz). With the clock frequencies stated, the maximum attack and release times are 204.8 ms and 1632.4 ms, respectively. The attack and release times may be changed easily by using different clock frequencies, and such variations are contemplated as falling within the scope of the present invention.

Figure 2:
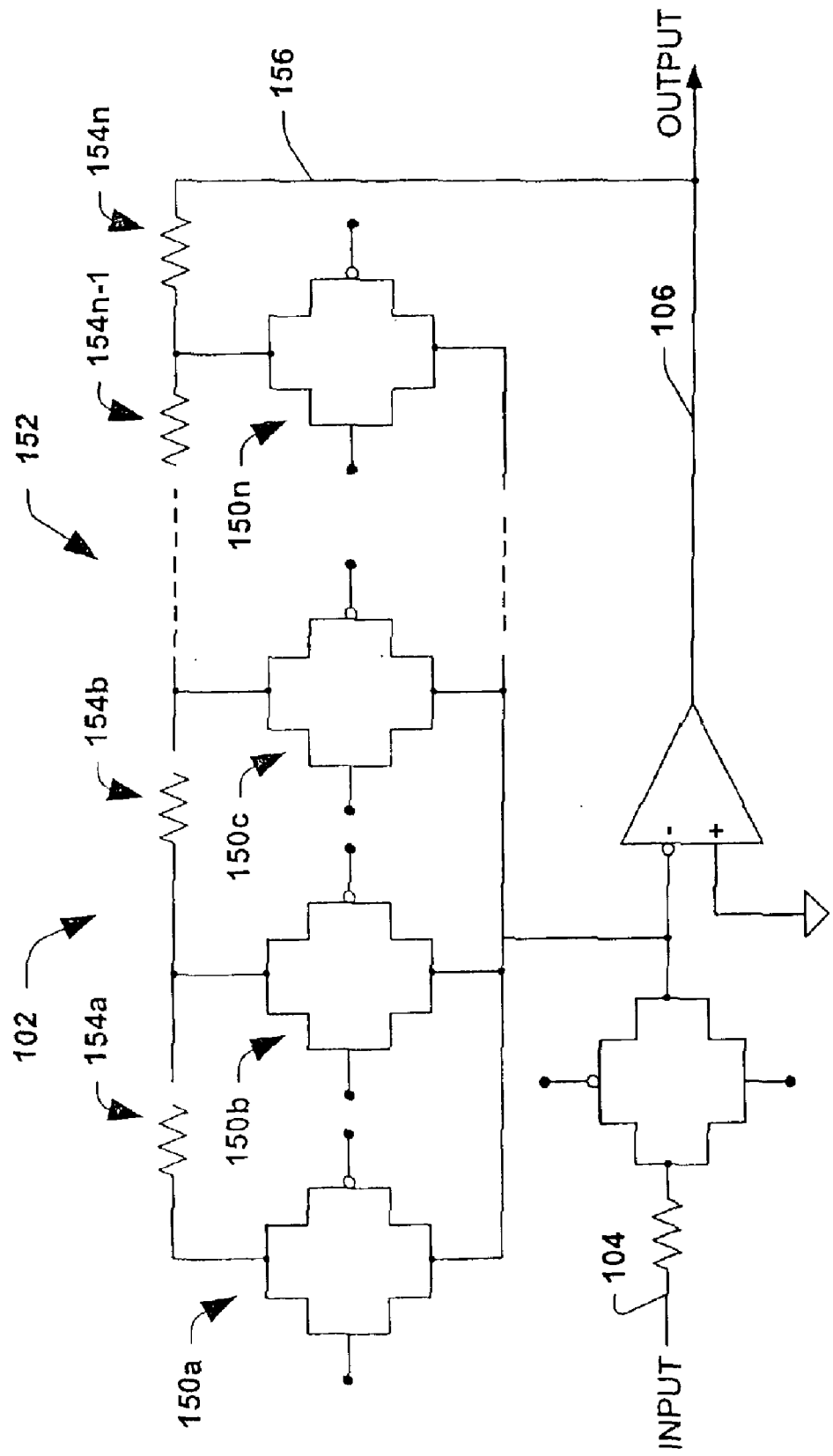
FIG. 2 is a combined block and schematic diagram of an exemplary digitally-controlled gain amplifier circuit according to the present invention.

Referring briefly to FIG. 2, a schematic diagram illustrates in greater detail the digitally-controlled gain amplifier 102 in accordance with one exemplary aspect of the present invention. The amplifier 102 comprises a plurality of CMOS type pass gates 150a–150n (sometimes referred to as analog switches) that control the gain of the amplifier 102. More particularly, depending on the multi-bit digital control word 114 (the digital gain control signal) output by the selection circuit 124 of FIG. 1, a predetermined number of pass gates 150a–150n will be on and another predetermined number will be off, thereby adjusting a feedback resistance 152 associated with a plurality of series-coupled resistors 154a–154n in a feedback loop 156 of the amplifier. Although the amplifier 102 of FIG. 2 is illustrated as one example, it should be understood that other types of digitally-controlled amplifier circuits may be employed, and all such alternatives are contemplated as falling within the scope of the present invention. In addition, although a single-ended amplifier is illustrated herein, a differential type amplifier may also be used and is appreciated by the present invention.

Figure 3:
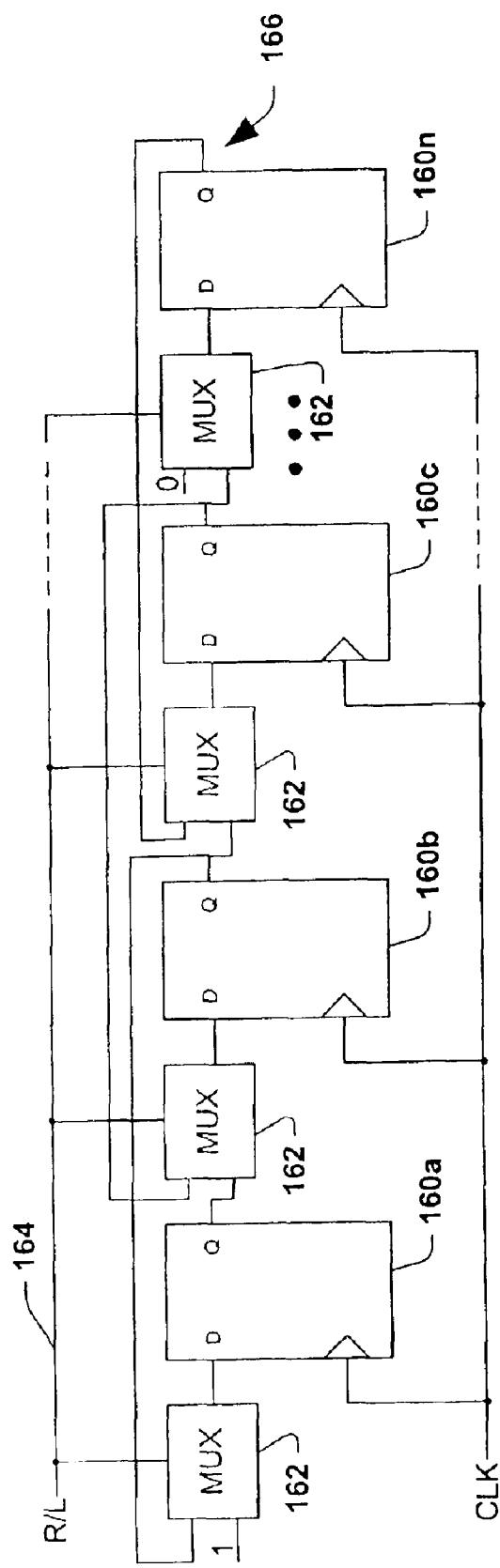
FIG. 3 is a block diagram illustrating an exemplary left/right shift register circuit according to the present invention.

Turning to FIG. 3, a block diagram illustrates in greater detail an exemplary left/right type shift register 117, 119 in accordance with an aspect of the present invention. The shift register comprises a plurality of D-type flip flops 160a–160n having multiplexers or selection circuits 162 associated therewith. When a shift right/left control signal 164 (e.g., first control signal 112 of FIG. 1) is a first state (e.g., a logic 1), the multiplexers 162 shift 1s in to the right; and when the shift R/L control signal 164 is a second state (e.g., a logic 0), the multiplexers 162 shift in 0s to the left. A "Q" output 166 of each of the flip-flops 160a–160n form the digital multi-bit word 120, 122 (A0:63, B0:63) illustrated in FIG. 1 which, depending on which is selected by the selection circuit 124, comprises the digital gain control signal 114 employed to drive the switches 150a–150n of FIG. 2 and thus modulate the amplifier gain in a digital fashion. With the exemplary shift register illustrated in FIG. 3, overflow thereof is not a problem. If the register contains all logic 1s, the gain is set to a minimum, and the new logic 1s shifted in have no effect. If a register contains all logic 0s, the gain is set to a maximum, and the new logic 0s shifted in have no effect.

Figure 4:
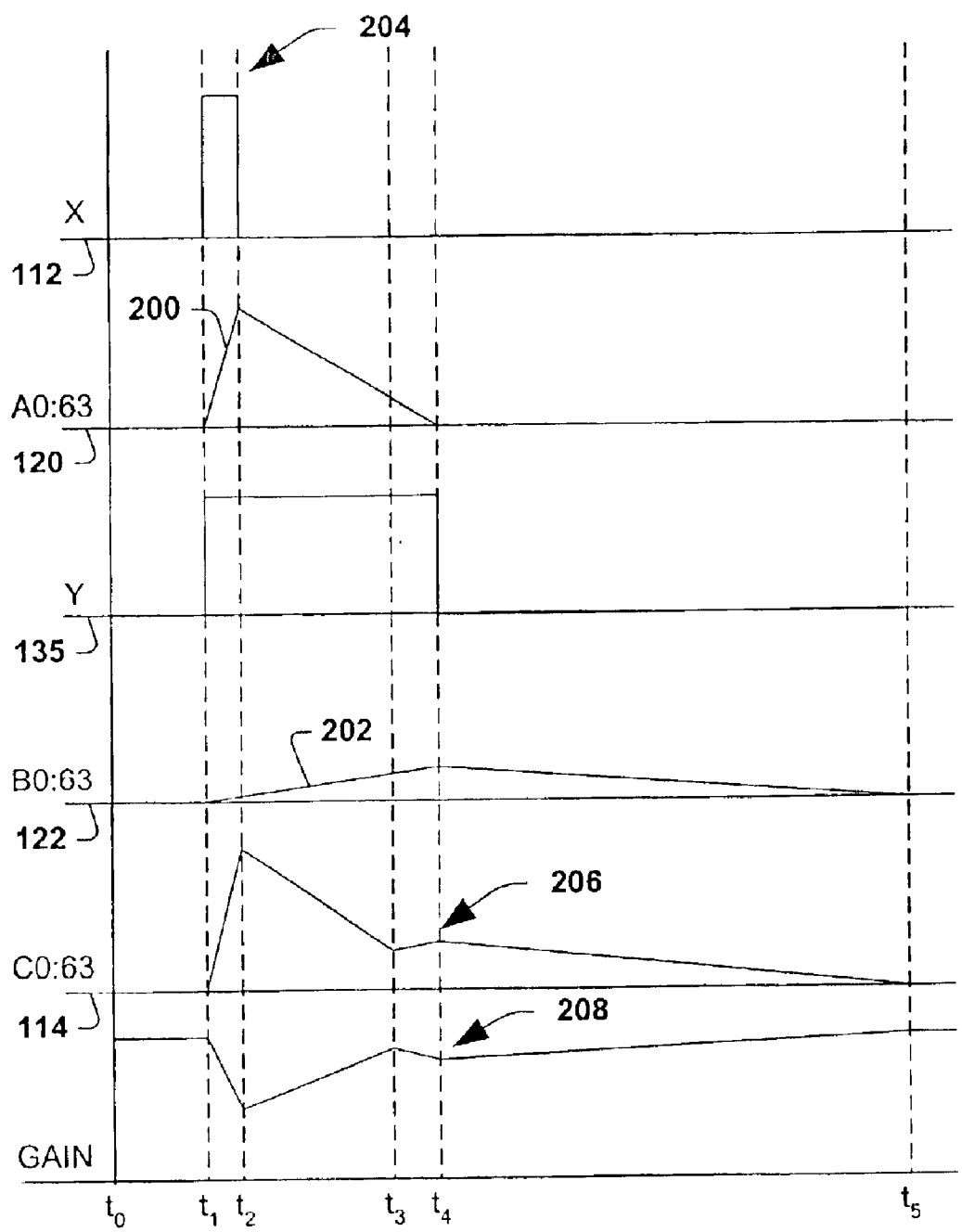
FIG. 4 is a timing diagram illustrating an exemplary operation of the circuits in FIGS. 1–3 according to the present invention.

FIG. 4 is a timing diagram illustrating a plurality of exemplary, typical waveforms of the control signals and the gain of the amplifier 102 for the operation of the circuit 100 of FIG. 1. At time $t_0$ the gain of the amplifier 102 is at its maximum and the output signal is below the threshold level of the comparator 108. The signals 120, 122 and 114 are all at a value of zero. In this description the signals 120, 122 and 114 (A0:63, B0:63 and C0:63) may take on values between 0 and 63. The value indicates the number of bits that are at a logic 1.

At time $t_1$ the output signal of the amplifier 102 steps to an amplitude above the threshold limit of the comparator 108 and the first control signal 112 ("X") goes to a logic 1. The F1_CLK signal 126 is selected by the MUX 130 and the first shift register 117 shifts logic 1s in to the right, causing the signal 120 (A0:63) to increase at a rate dictated by the frequency of F1_CLK and as illustrated by a slope 200 in FIG. 4. As the signal 120 increases, the gain is reduced at a rate related to the digital gain control signal 114 which, at the present time, is also the output 120 of the first shift register 117. Also at this time, since the signal 120 is greater than 0 (e.g., signal 120 has 1 or more logic 1s), a second control signal 135 ("Y") goes to a logic 1, and a MUX 137 selects the F3_CLK signal 134 and the second shift register 119 also shifts 1s in to the right and the signal 122 increases. The signal 122 increases more slowly than the signal 120 because F3_CLK 134 is a lower frequency than F1_CLK 126, as illustrated by a slope 202 in FIG. 4.

At time $t_2$ the output signal at 106 drops in level below the threshold level, and the first control signal 112 ("X") returns to a logic 0. Thus the first control signal 112 is a relatively short pulse 204, thus representing a transient audio condition (e.g., a door slamming or other sudden loud noise). The clock signal 128 (F2_CLK) then is selected by the MUX 130 and the first shift register 117 shifts 0s in to the left. Since the value of the first shift register 117 is still greater than zero, the second control signal 135 ("Y") remains a logic 1 and the second shift register 119 continues to shift 1s in to the right (as evidenced by signal 122 (B0:63) continuing to increase during this time period between $t_2$ and $t_3$). At time $t_3$ the value of the signal 122 is greater than the signal 120 and the second shift register 119 controls the gain of the circuit. Note that the second shift register 119 is still increasing at this time because the output 120 of the first shift register 117 is still greater than zero.

At time$_4$ the first shift register 117 is filled with logic 0s (signal 120, A0:63=0) and the second control signal 135 ("Y") returns to a logic 0. This in turn, causes the second shift register 119 to shift logic 0s in to the left using the F4_CLK clock signal 136 selected by the MUX 137. Finally at time $t_5$ the second shift register 119 has returned to all logic 0s and the gain has returned to its maximum value.

FIGS. 1–4 provide only a simplified view of the circuit concept. The detail design will consider things such as synchronous logic, setup and hold times, etc. Also, other implementations may be feasible, such as a 6-bit counter with a 6-to-64 decoder instead of using 64 flip-flops. Of course if a 6-bit counter is used, underflow and overflow logic is needed. Tradeoffs may exist between the shift register and the counter, and it is appreciated that based on various design criteria, one implementation may be more desirable than another. In addition, since in one example, the present invention is employed in a hearing aid system in which an input microphone or transducer may have various tolerances (e.g., +/-4 dB), an adjustable gain (e.g., a -6 dB to +6 dB adjustment) may be employed. This aspect of the present invention can be easily implemented with the shift register design by forcing the left-most flip-flops to a logic 1 state or the right-most flip flops to a logic 0 state to vary the maximum or minimum gain available via, for example, an initial calibration.

Therefore as can be seen in the above example, the first and second shift registers 117 and 119 in conjunction with supporting circuitry operate as first and second digital gain modulation circuits 116, 118 that operate to modulate a gain via a digital gain control signal 114 at a plurality of rates. In particular, in the above example, the circuit 110 provides for two different attack times and two different release times that are employed based on circuit conditions. Therefore the system 100 of FIG. 1 advantageously employs the fast attack and release times in environmental conditions where transient sounds occur (e.g., a loud sudden noise such as a door slamming or a dish breaking), while slower attack and release times are employed in steady state type conditions such as background noise conditions (e.g., in a crowded restaurant). By dynamically employing differing attack and release times in a digital fashion, a user having the circuit 110 within a hearing aid can hear such widely varying input signal in a controlled amplified fashion without significant distortion.

In addition, the present invention exhibits, in its digital operation, several advantages over conventional analog type compression solutions. For example, integrating analog components such as substantial size resistors and capacitors in a monolithic solution such as an integrated circuit is difficult. Use of discrete resistors and/or capacitors are undesirably large for many applications such as hearing aids. Further, such discrete components, particularly when made physically small, exhibit wide variations in component values over temperature and from device-to-device. Such variations with respect to temperature thus require more sophisticated circuit techniques to compensate for such variations. Variations in component values from device-to-device in some application are significant problems such as in the disposable hearing aid market in which a new hearing aid is obtained every couple of weeks or so. In such cases variations result in perceivable performance variations that are substantially undesirable to the user.

The present invention advantageously provides a digital control solution that can be easily integrated into a single integrated circuit. In addition, the attack and release times can be controlled accurately. By dividing down clock signals from the highest frequency clock signal, the relative variations therebetween are further accurately maintained. Furthermore, the shift registers can be made to have greater or fewer outputs which allow a designer to customize the modulation granularity, for example, to ensure that the discrete increases/decreases in gain are small enough not to be easily discernable by the human ear.

Although the circuit 100 of FIG. 1 provides substantial advantages over the prior art, in some cases the circuit gain during the release time can become non-monotonic. That is, the circuit gain can, for a short period of time, modulate in the wrong direction before being corrected. For example, in a situation when the fast shift register (register 117) stops shifting to the right to stop decreasing the gain, the slow shift register (register 119) is still shifting to the right, and a small overshoot on the gain modulation will occur before the gain begins going back up. Such overshoot is seen, for example, at 206 and 208 of FIG. 4.

Figure 5:
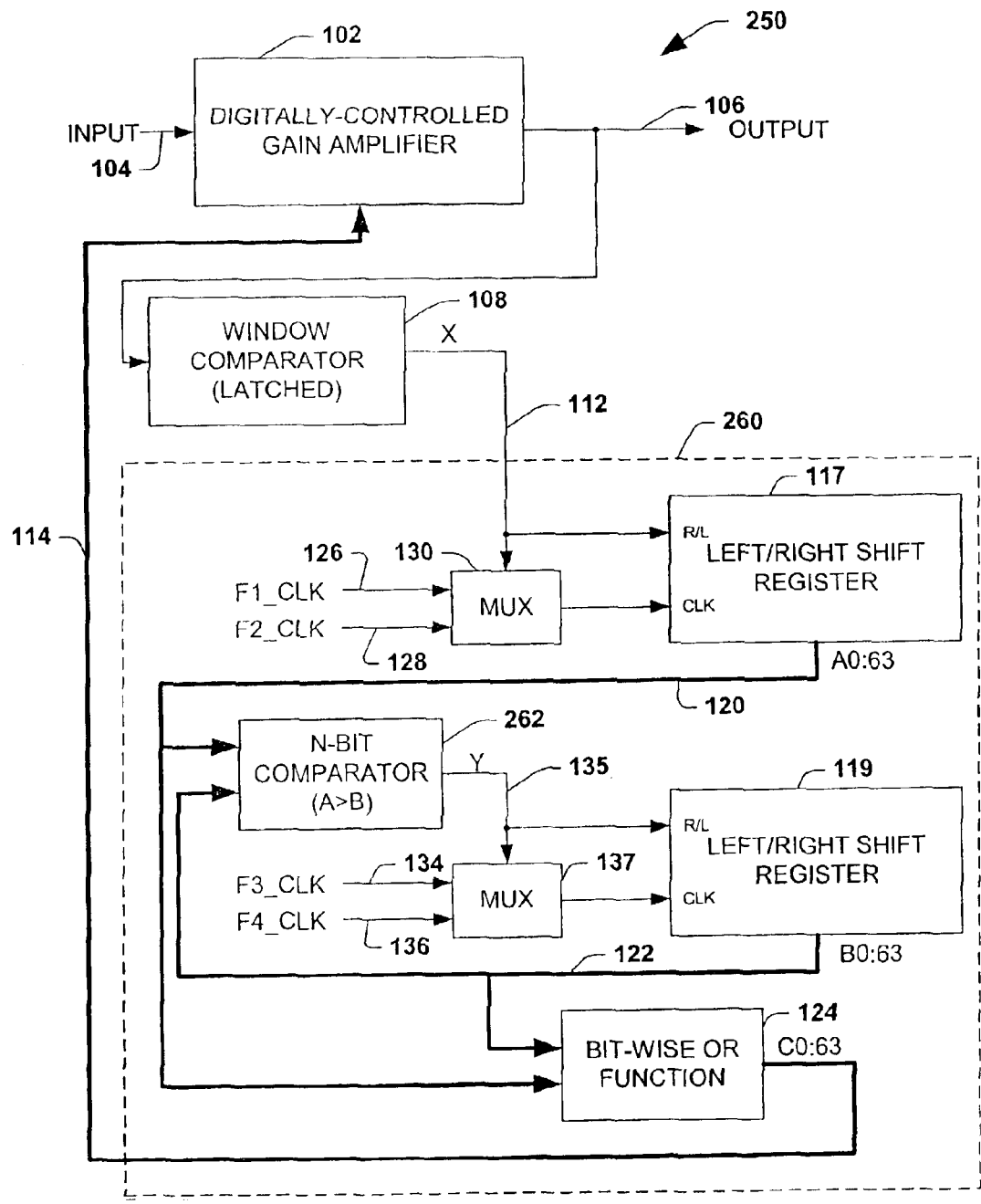
FIG. 5 is a block diagram illustrating a digitally-controlled compression amplifier circuit according to another exemplary aspect of the present invention.

Turning now to FIG. 5 a low distortion compression amplifier circuit 250 is illustrated in accordance with another exemplary aspect of the present invention. The amplifier circuit 250 comprises an improvement over the circuit 100 of FIG. 1, at least in one respect, wherein circuit 250 employs modified control logic to ensure that the gain during the release period is monotonic.

The circuit 250 of FIG. 5 is similar in many respects to the circuit 100 of FIG. 1, except that a digital gain control circuit 260 employs a second logic circuit 262 therein. The second logic circuit 262 replaces the first logic circuit 132 of FIG. 1 with different functionality so as to ensure that the gain during release remains monotonic. In the present example, the second logic circuit 262 comprises a comparator circuit that compares the multi-bit outputs 120, 122 of the shift registers 117, 119 and generates the second control signal 135 in accordance therewith to control both the shifting direction of the second shift register 119 and the shifting frequency (via selection of signal 134 or 136).

The circuit 250 operates, in some manners, similar to the circuit 100 of FIG. 1. For example, the shift registers operate to provide first and second gain control signals 120 and 122, wherein depending upon which signal is selected by the selection circuit 124, different attack and release times can be implemented for gain modulation. In this example, as a logic 1 is shifted in to the right of either shift register, the gain of the amplifier is reduced by 0.5 dB for each 1 shifted in. Also, the multiplexers 130 and 137 select a clock signal to dictate the register shifting rate based on the first and second control signals 112 and 135, respectively. When F1_CLK (~160 kHz) is selected, this clock frequency sets the maximum attack time. The maximum attack time is 64/160 kHz=0.4 ms. When the gain of the amplifier is reduced, the output is reduced until it is within the limits of the window comparator 108. The direction of the shift register is then changed and logic 0s are shifted in to from the right (for the first shift register 117). As the logic 0s shift towards the left, the gain of the amplifier is increased by 0.5 dB. The multiplexer 130 selects a slower clock F2_CLK (1.25 kHz) for the release operation. The maximum release time is given by 64/1250 Hz=51.2 ms.

While the first shift register 117 uses relatively fast clock frequencies for a fast attack and release, the second shift register 119 uses slower clock frequencies for slower attack and release times. The second logic circuit 262, for example, an N-bit comparator, determines if the value of the first shift register 120 (A0:63) is larger than the value of the second shift register 122 (B0:63). Whenever A0:63 is larger than B0:63 (e.g., contains more logic 1s), the second shift register 119 will shift logic 1s in to the right. Whenever A0:63 is smaller than B0:63 (e.g., has less logic 1s), the second shift register 119 will shift logic 0s in to the left. The operation of the second shift register is similar to the first shift register described above, however, the clock frequencies used for the attack and release times are quite different. F3_CLK 134 is 312.5 Hz and F4_CLK 136 is 39.0625 Hz.

Note that all clock frequencies in the present example are binary fractions of the highest clock frequency (160 kHz). Although binary-weighted frequencies are not mandatory, it does make the circuitry less complex. With the clock frequencies stated, the maximum attack and release times are 204.8 ms and 1632.4 ms, respectively. The attack and release times can easily be changed by using different clock frequencies.

The analog switches that control the gain of the amplifier are controlled by the selection circuit 124 (e.g., a bit-wise OR circuit) which selects one of the outputs of the two shift registers. In this way, the gain of the amplifier and the release time is controlled by the shift register that contains the most logic 1s and such control occurs in a digital fashion.

Figure 6:
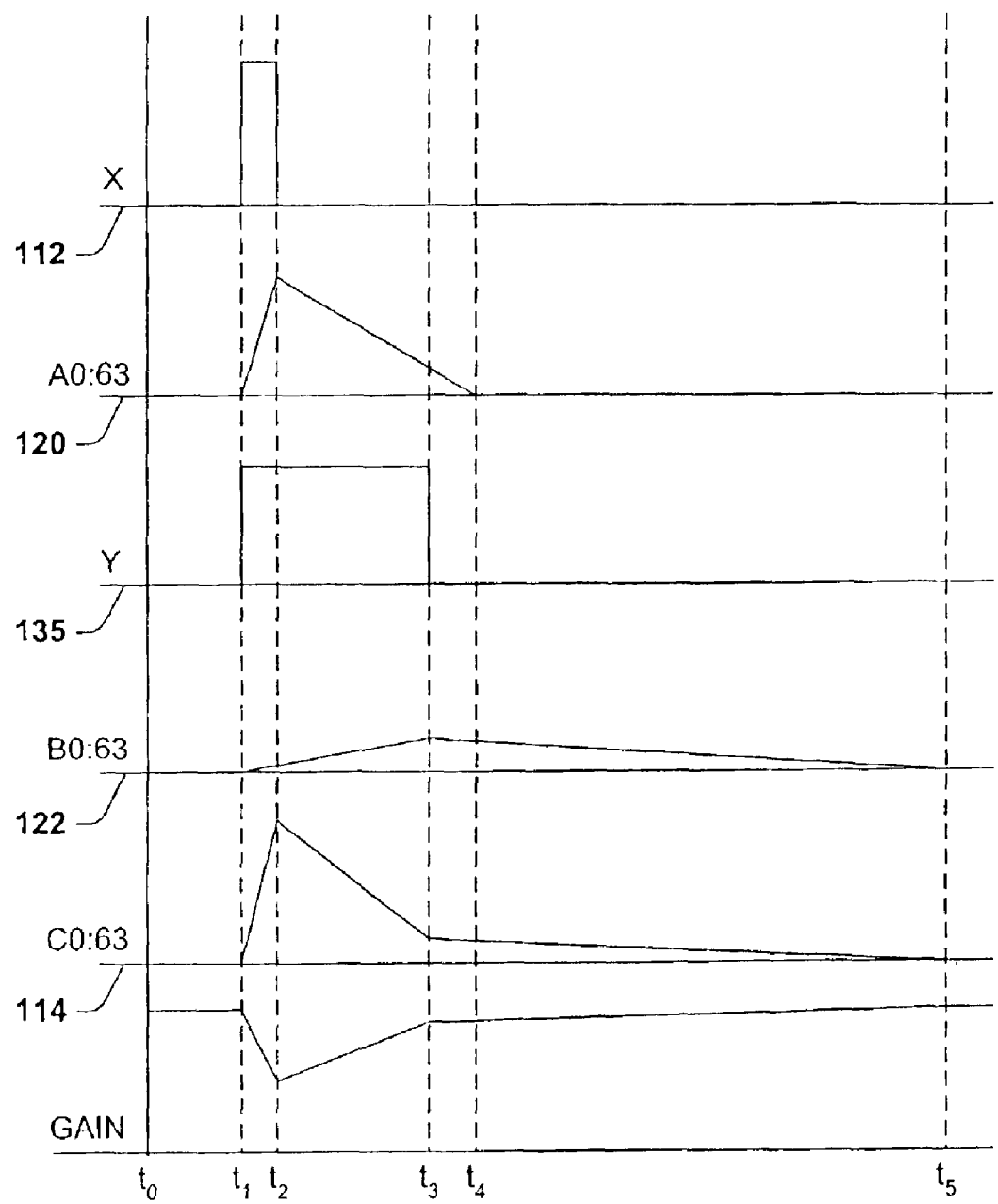
FIG. 6 is a timing diagram illustrating an exemplary operation of the circuit of FIG. 5 according to the present invention.

FIG. 6 shows typical waveforms of the control signals 112, 135 and the gain of the amplifier for the operation of the circuit 250. At time $t_0$ the gain is at its maximum and the output signal at 106 is below the threshold level. The signals 120, 122 and 114 are all at a value of zero, and in this description represent the signals A0:63, B0:63 and C0:63 respectively, and may take on values between 0 and 63. The value indicates the number of bits that are at a logic 1. At time $t_1$ the output signal steps to an amplitude above the threshold limit and first control signal 112 ("X") goes to a logic 1. The F1_CLK signal 126 is selected by the MUX 130 and the first shift register 117 shifts logic 1s in to the right, causing the signal 120 to increase. As signal 120 increases, the gain is reduced. Also at this time, since the value of signal 120 is greater than the output signal 122 of the second shift register 119, the second control signal 135 ("Y") goes to a logic 1, and selects the F3_CLK signal 134 via the MUX 137 and the second shift register 119 also shifts 1s in to the right and the value of the signal 122 increases, however, signal 122 increases at a rate slower than the signal 120 because F3_CLK 134 is a lower frequency than F1_CLK 126.

At time $t_2$ the output signal at 106 drops in level below the threshold level, and the first control signal 112 ("X") returns to a logic 0. Clock frequency F2_CLK 128 is selected by the MUX 130 and the first register 117 shifts 0s in to the left. Since the value of the signal 120 register is still greater than the signal 122, the second control signal 135 ("Y") remains a logic 1 and the second shift register 119 continues to shift 1s in to the right. At time $t_3$, however, the value of the signal 122 becomes greater than that of signal 120 and the second shift register 119 controls the gain of the circuit 250. Also, since the signal 122 is now greater than signal 120, the second control signal 135 ("Y") goes to a logic 0, and clock frequency F4_CLK 136 is selected for the second shift register 119 and the register shifts 0s in to the left. Note that in FIG. 6, the circuit 250 operates differently than the circuit 100 of FIG. 1 (and FIG. 4) at $t_3$. In particular, the second control signal 135 ("Y") goes to a logic 1 at an earlier time (since the signal 120 does not have to go all the way down to 0 before the second logic circuit 262 activates the signal 135). Note in the gain signal between times $t_3$ and $t_4$ of FIG. 6 (as compared to FIG. 4), the gain does not dip back down substantially, only to again begin increasing. Therefore the second logic circuit 262 of FIG. 5 advantageously prevents the gain in the circuit 250 from becoming more non-monotonic.

At time $t_4$ the first shift register 117 is filled with logic 0s (the signal 120, A0:63=0). The second shift register 119 is shifting 0s in to the left and finally at time $t_5$ the second shift register 119 has returned to all logic 0s and the gain has returned to its maximum value.

FIG. 5 provides a simplified view of the circuit concept. The detail design may consider things such as synchronous logic, setup and hold times, etc. which are appreciated by those of ordinary skill in the art. Also, other implementations may be feasible, such as a 6-bit counter with a 6-to-64 decoder instead of using 64 flip-flops. Of course if a 6-bit counter is used, underflow and overflow logic is needed. As discussed previously, tradeoffs may exist between the shift register and the counter, however, both options are contemplated by the present invention. Also, as highlighted supra, an adjustable gain (e.g., a −6 dB to +6 dB adjustment) may be implemented to compensate for input transducer tolerances (e.g., variations in an input microphone). Such adjustments may be implemented, for example, with the shift register design by forcing the left-most flip-flops to a logic 1 state or the right-most flip-flops to a logic 0 state to alter the maximum or minimum gain.

The circuit 250 of FIG. 5 is more monotonic than the circuit 100 of FIG. 1. However, when the second shift register 119 finally reaches a value (signal 122) equal to the output 120 of the first shift register 117, the second control signal 135 goes low and the register 119 begins shifting in a 0 to the left to decrease the value, thus causing the state of the second control signal 135 to change again. Therefore the circuit 250 will have a small, continuous gain modulation due to the second shift register 119 shifting in alternate directions. Although each incremental change in gain can be made small enough to not notice (e.g., <1 dB), such a constant gain modulation due to the variation in the digital gain control signal 114 at a high frequency (e.g., >100 Hz) can be detected in some cases on the output 106 as a slight buzzing sound due to distortion products from the gain modulation. Therefore according to yet another aspect of the present invention, a circuit 300 is provided in FIG. 7 that constitutes an improvement over the circuit 250, at least in one respect, by eliminating the above-described distortion.

Figure 7:
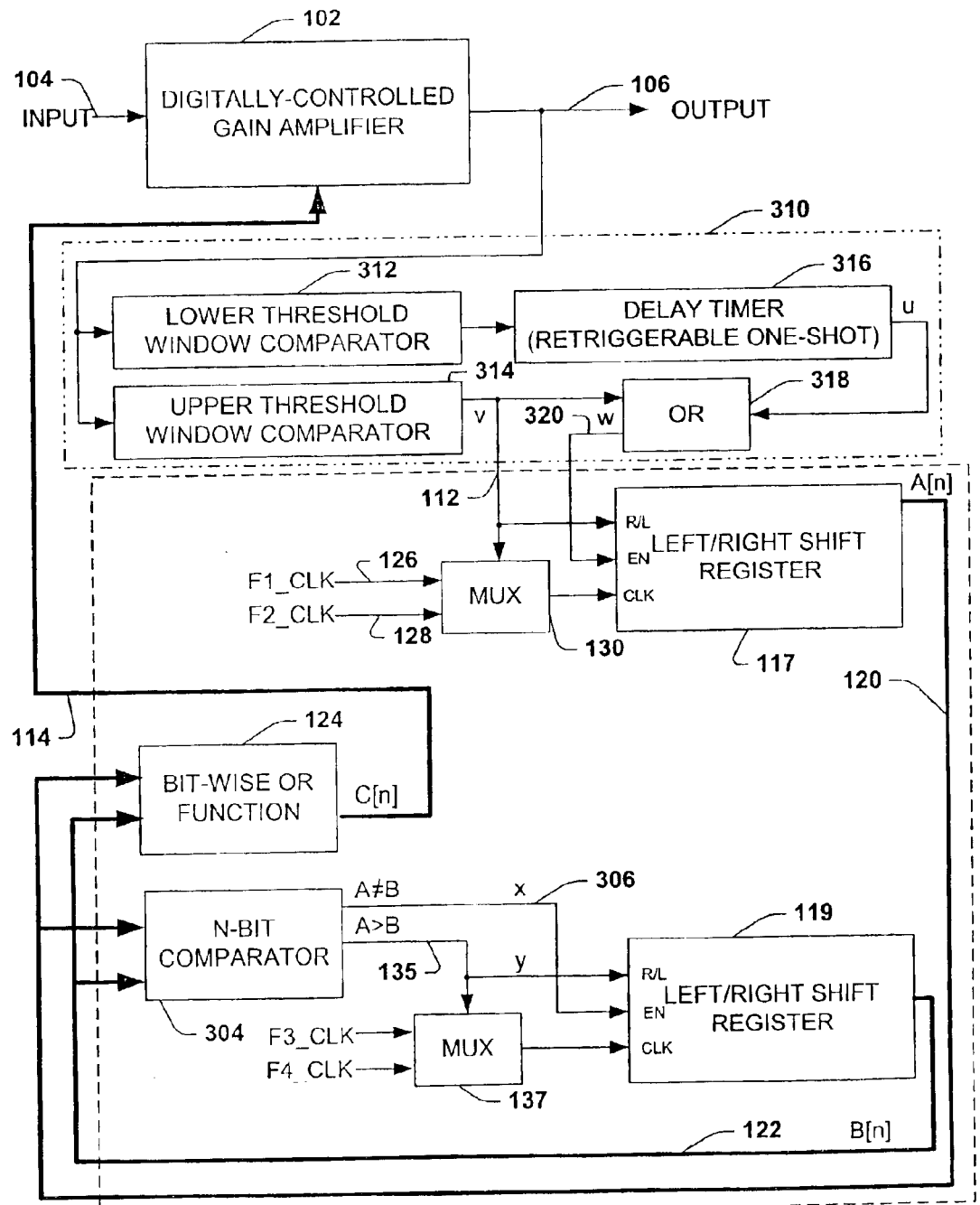
FIG. 7 is a block diagram illustrating a digitally-controlled compression amplifier circuit according to yet another exemplary aspect of the present invention.

The circuit 300 of FIG. 7 is similar in many ways to the circuits of FIGS. 1 and 5, respectively. The circuit 300, however, employs a digital gain circuit 302 that employs a third logic circuit 304. The third logic circuit 304 (e.g., a multi-output comparator circuit) provides the second control signal 135 ("y") and an enable signal 306 ("x"). When the signal 120 from the first shift register 117 is greater than the signal 122 from the second shift register 119, the signals are not equal, thus the enable signal 306 is high (enabling the second shift register 119 to shift) and the second control signal 135 is high, dictating that the second shift register 119 shift in 1s to the right.

When the second shift register output 122 finally reaches the value of the output 120 (of the first shift register 117), the enable signal 306 goes low, thereby disabling the second shift register 119 and preventing the gain control signal from continuously going up and down in one (1) increment intervals. Therefore according to the present invention, the third logic circuit 304 is operable to disable the second shift register 119 when the signals 120 and 122 are equal, thereby preventing the buzzing distortion highlighted above.

In addition, the circuit 300 of FIG. 7 includes a comparator circuit 310 having a lower threshold comparator 312 and an upper threshold comparator 314, respectively. The comparators 32, 312 operate in conjunction with a delay timer circuit 316 and logic 318 to enable the first shift register 117 via an enable signal 320 ("w") and the first direction via the first control signal 112. The comparator circuit 310 is operable to initiate shifting of the first shift register 117 in different directions when the output signal at 106 extends outside a signal range defined by the upper and lower thresholds, respectively. In addition, by employing the delay timer 316, the circuit 300 does not make modulation changes too hastily.

Referring again to FIG. 7, analysis may begin with a small input signal and the amplifier at its maximum gain. If the output signal at 106 exceeds the upper threshold of comparator 314, the gain will be reduced until the output signal no longer exceeds the upper threshold. As long as the output signal exceeds the lower threshold of comparator 312, the delay timer 316 will be reset and the gain of the amplifier will not be allowed to change. However, if the output signal does not exceed the lower threshold, the delay timer 316 will time out at which point the amplifier gain will be allowed to increase.

The digital gain control circuit 302 includes fast and slow shift registers 117 and 119, respectively. The fast shift register 117 is controlled by the outputs 112, 319, 320 of the upper and lower window comparators 312, 314. In other words, the output signal controls the fast shift register. The slow shift register 119 is controlled by the output 120 of the fast shift register 117 and the third logic circuit 304. Basically, the slow shift register 119 tries to keep up with the fast shift register 117. A bit-wise OR 124 of the outputs 120, 122 of the two shift registers is what controls 114 the gain of the amplifier 102.

Computer programs, written in C, were developed to simulate the performance of this compression amplifier algorithm. By processing many types of audio signals and performing listening tests, the attack and release times of each shift register was optimized, however, variations in such attack and release times may be employed and are contemplated as falling within the scope of the present invention. The delay timer 135 may be set up as a counter being clocked at the F1_CLK rate, and hence the delay time (e.g., about 50 ms) is related to the value of the counter. Also, the ratio of the upper and lower threshold may be optimized, but variations are contemplated by the present invention. Exemplary values for the above parameters are given in table I.

TABLE I

Exemplary values for compressor control parameters.

| Parameter | Minimum | Nominal | Maximum | Units | Comments |
|---|---|---|---|---|---|
| F1_CLK | — | 160 | — | kHz | |
| F2_CLK | — | 625 | — | Hz | F1_CLK/256 |
| F3_CLK | — | 78.125 | — | Hz | F1_CLK/2048 |
| F4_CLK | — | 19.53125 | — | Hz | F1_CLK/8192 |
| Hysteresis | 2.5 | 3.0 | 3.5 | dB | |
| Delay time | 48.0 | — | 51.2 | ms | |

A hysteresis (ratio between the upper and lower threshold voltages) of 3.0 dB was used during the testing and simulations and has proved to be acceptable with a variety of different audio signals. A tolerance of 0.5 dB around this nominal value should be acceptable. If the upper threshold is set to 200 mV, for example, then the lower threshold may be between 133.7 and 150.0 mV and nominally would be set to 141.6 mV.

The delay time used in the simulations was 51.2 ms. The delay time was based on a delay count of 8192 using a 160 kHz clock frequency. Lower clock frequencies may be used with a corresponding lower delay count. Due to the asynchronous nature of the audio signal to the clock, the actual delay will vary by one count of the clock. Assuming an n-bit counter, the maximum delay count can be is $2^{n-1}$. Finally, the delay time will vary from (delay_count-1)/clock_frequency to (delay_count)/clock_frequency. Table II provides values for the clock frequency and delay count, as well as the minimum and maximum delay times expected. For those conditions.

TABLE II

Performance of different configurations for the delay counter.

| Clock Frequency | n (n-bit counter) | Delay count | Minimum Time | Maximum Time |
|---|---|---|---|---|
| 160 kHz | 13 | 8191 | 51.1875 ms | 51.19375 ms |
| 80 kHz | 12 | 4095 | 51.175 ms | 51.1875 ms |
| 40 kHz | 11 | 2047 | 51.15 ms | 51.175 ms |
| 20 kHz | 10 | 1023 | 51.1 ms | 51.15 ms |
| 10 kHz | 9 | 511 | 51.0 ms | 51.1 ms |
| 5 kHz | 8 | 255 | 50.8 ms | 51.0 ms |
| 2.5 kHz | 7 | 127 | 50.4 ms | 51.8 ms |
| 1.25 kHz | 6 | 63 | 49.6 ms | 50.4 ms |
| 625 Hz | 5 | 31 | 48.0 ms | 49.6 ms |
| 312.5 Hz | 4 | 15 | 44.8 ms | 48.0 ms |
| 156.25 Hz | 3 | 7 | 38.4 ms | 44.8 ms |

TABLE II-continued

Performance of different configurations for the delay counter.

| Clock Frequency | n (n-bit counter) | Delay count | Minimum Time | Maximum Time |
|---|---|---|---|---|
| 78.125 Hz | 2 | 3 | 25.6 ms | 38.4 ms |
| 39.0625 Hz | 2 | 2 | 25.6 ms | 51.2 ms |
| 19.53125 Hz | 1 | 1 | 0 ms | 51.2 ms |

Given the requirement for a delay of at least 48 ms, a 5-bit counter running at a clock frequency of 625 Hz is a counter that may be used. Smaller counters (i.e., less bits) may not provide the resolution needed, while longer counters may waste power and size, however, such variations may be employed and are contemplated as falling within the scope of the present invention.

Figure 8:
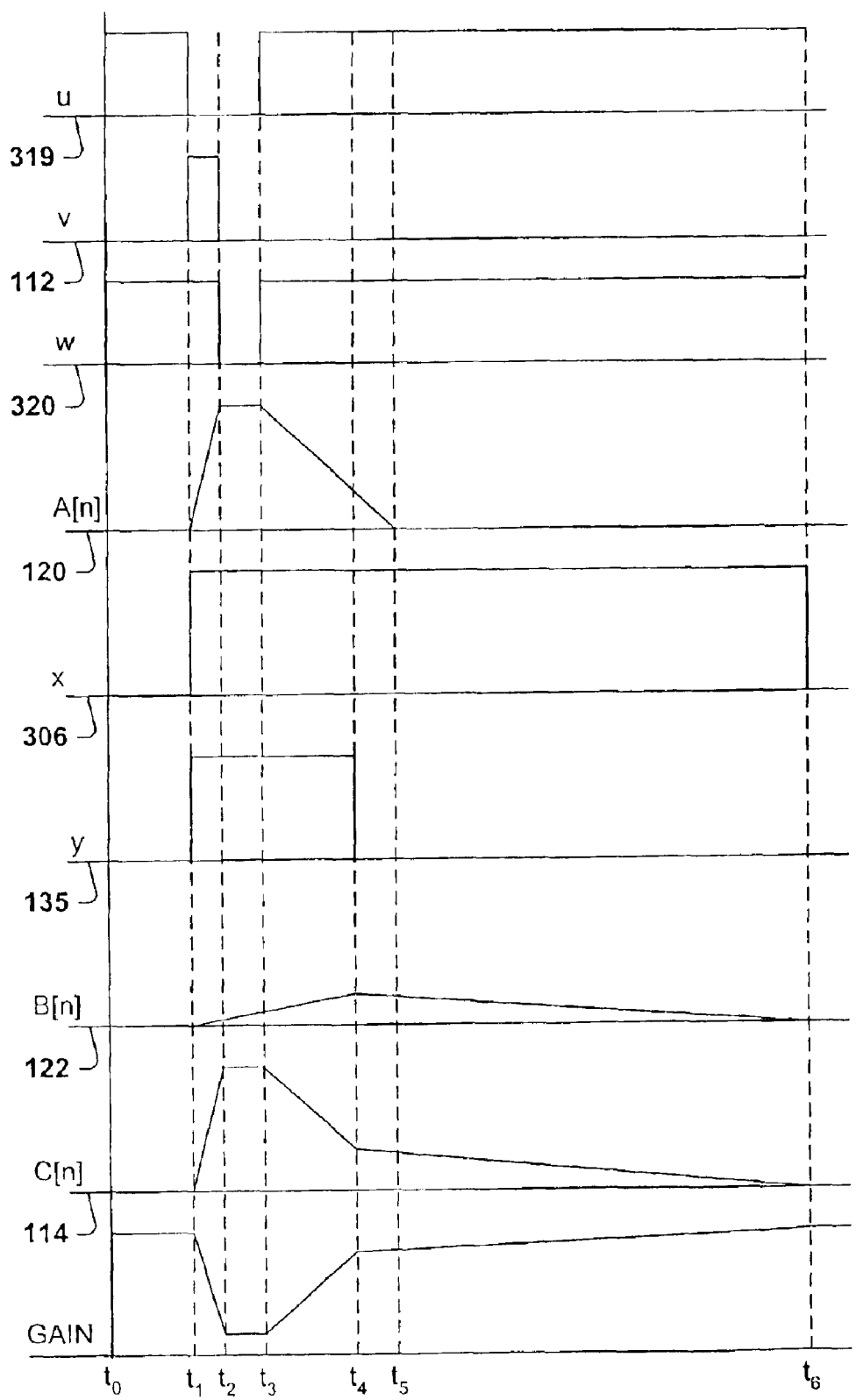
FIG. 8 is a timing diagram illustrating an exemplary operation of the circuit of FIG. 7 according to the present invention.

FIG. 8 illustrates exemplary waveforms of the control signals and the gain of the amplifier for the operation of the circuit 300 of FIG. 7. At time $t_0$ the gain is at its maximum and the input signal is below the threshold levels. The signals 120, 122 and 114 are all at a value of zero. In this description, 120, 120 and 114 represent the signals A[n], B[n] and C[n], respectively, and may take on values between 0 and 63. The value indicates the number of bits that are at a logic 1. At time $t_1$ the input signal steps to an amplitude above the upper threshold limit of comparator 314 and the first control signal 112 ("v") goes to a logic 1. At the same time, the delay counter 316 is reset and the delay signal 319 ("u") goes to a logic 0. The F1_CLK signal 126 is selected by the MUX 130 and the first shift register 117 shifts logic 1s in to the right causing the signal 120 to increase. As signal 120 increases, the gain is reduced. Also at this time, since signal 120 is greater than the output 122 of the second shift register 119, signals 306 and 135 ("x" and "y") both go to a logic 1, causing the F3_CLK signal to be selected by the MUX 137 and the second shift register 119 also shifts 1s in to the right and the signal 122 increases. The signal 122 increases at a slower rate than signal 120 because F3_CLK is a lower frequency than F1_CLK.

At time $t_2$ the input signal drops in level below the threshold levels, and signal 112 ("v") returns to a logic 0. The delay counter 316 has not yet timed out, so signal 319 ("u") remains a logic 0. The first register 117 does not increase (signal 120) or decrease, but the second shift register 119 does continue to increase (signal 122), trying to catch up to the first shift register 117. At time $t_3$, the delay timer 316 times out. Clock frequency F2_CLK 128 is then selected by the MUX 130 and the first shift register 117 shifts 0s in to the left. Since the value 120 of the first shift register 117 is still greater than that 122 of the second shift register 119, signal 135 ("y") remains a logic 1 and the second shift register 119 continues to shift 1s in to the right. At time $t_4$ the value 122 of the second shift register 119 becomes greater than signal 120 and the second shift register 119 controls the gain of the circuit 300. Also, since signal 122 is now greater than signal 120, the signal 135 ("y") goes to a logic 0, and the clock frequency F4_CLK is selected for the second shift register 119, causing it to shift 0s in to the left.

At time $t_5$ the first shift register 117 is filled with logic 0s (signal 120=0). The second shift register 119 is shifting 0s in to the left and finally at time $t_6$ the second shift register 119 has returned to all logic 0s and the gain has returned to its maximum value.

In FIG. 7, an OR logic circuit 318 generates the signal 320 ("w") from signals 319 and 112 ("u" and "v"). The table below explains the operation of the circuit 318.

| u | v | w | conditions | operation |
|---|---|---|---|---|
| 0 | 0 | 0 | Delay not timed-out | Disable shift register |
| 0 | 1 | 1 | Signal > upper threshold | Enable shift register (right shift) |
| 1 | 0 | 1 | Delay timed-out and signal < lower threshold | Enable shift register (left shift) |
| 1 | 1 | 1 | Invalid state (see text) | Enable shift register (right shift) |

The "Invalid state" shown in the above table, can not exist. If the signal is large enough to exceed the upper threshold (e.g., greater than an acoustical level of 85 dBSPL), then the signal is also larger than the lower threshold (e.g., an acoustical level of 82 dBSPL) in which case the delay timer 316 is reset and can not time out. The shift register is enabled and allowed to shift right to reduce the amplifier gain.

Figure 9:
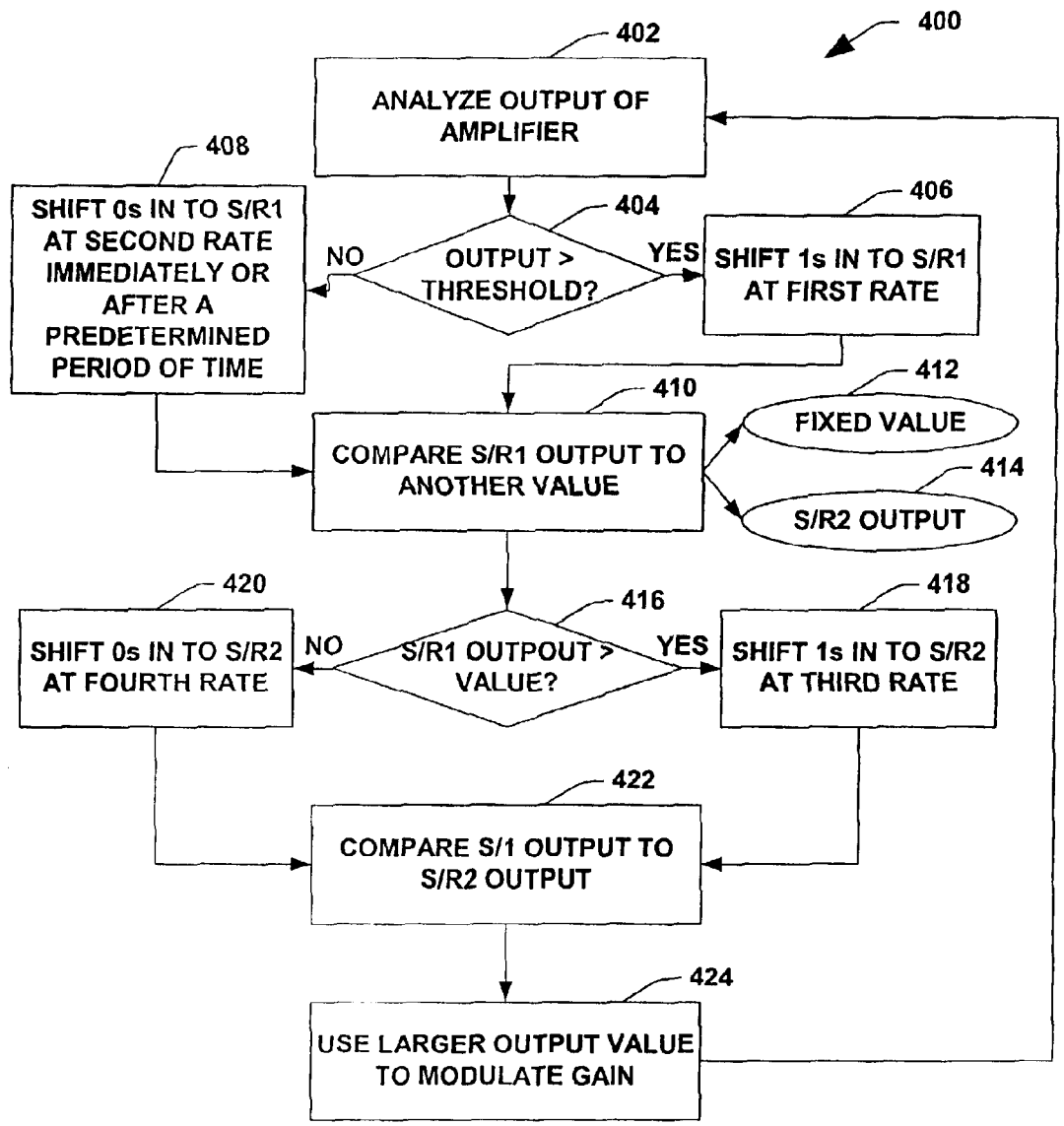
FIG. 9 is a flow chart diagram illustrating a method of compressing an input signal using digital control to reduce distortion according to still another exemplary aspect of the present invention.

In accordance with yet another aspect of the present invention, a method of digitally controlling the gain in a compression amplifier is disclosed, as illustrated in FIG. 9 and designated at reference numeral 400. Although the method 400 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated acts or events may be required to implement a methodology in accordance with the present invention.

The method 400 begins at 402 with an analysis of the output signal of the amplifier. For example, such analysis may comprise comparing the output signal to a predetermined threshold or evaluating the signal in accordance with predetermined criteria. If the signal is greater than a threshold at 404 (YES), a first shift register is activated, for example, shifting 1s in to the right at a first shift rate at 406. If the output does not exceed the threshold at 404 (NO), then 0s are shifted in to the left at a second rate at 408. In addition, at 408 such shifting of 0s may be delayed for a predetermined period of time after the output signal is determined to have fallen below the threshold. Initially, when the circuit is at maximum gain, if the result of inquiry 404 is NO, the gain will not be changed because the first shift register is already full of 0s. Note that depending upon any initial calibration, a maximum gain or minimum gain may be selected from a plurality of predetermined values which may prohibit the number of 1s or 0s shifted in to the shift register, as may be desired.

In either event (406 or 408), a comparison of the first shift register parallel output is made with another value at 410. As discussed above, the other value may comprise a fixed value 412 such as zero (0) (e.g., as in FIG. 1), or the output of a second shift register 414 (e.g., as in FIG. 5). If the first register output is greater than the compared value at 416 (YES), then 1s are shifted in to the right of the second shift register at 418 at a third shift rate. Otherwise (NO at 416), 0s are shifted in to the left of the second shift register at a fourth shift rate at 420.

Regardless of the comparison result at 416, the outputs of the shift registers are compared at 422, and the larger output value is selected to modulate the gain at 424. In the above manner, the gain is modulated at differing attack and release times depending upon circuit conditions, and such gain modulation control is performed in a digital fashion.

As highlighted above, variations of the method 400 may be implemented to further refine or improve the invention as desired. For example, prior to 416, an additional inquiry may be made such as whether the output of the first and second shift registers are equal (e.g., as discussed with FIG. 7), wherein a subsequent disabling of the second shift register occurs upon meeting such condition. In addition, as discussed in conjunction with FIG. 7, the analysis of the amplifier output may comprise comparing the output value to a plurality of thresholds such as upper and lower threshold so that shifting of the first shift register occurs only when output extends outside of a predetermined range. Any such modifications may be employed and such modifications are contemplated as falling within the scope of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A low distortion compression amplifier, comprising:
   an amplifier circuit having an input and an output, wherein an input signal is received at the input and amplified in accordance with a gain to form an output signal at the output;
   a comparator circuit operable to receive the output signal and generate a first control signal in response thereto; and
   a digital gain control circuit coupled to the amplifier circuit, and operable to generate a digital gain control signal based at least in part on the first control signal, and wherein the gain control signal is operable to modulate the gain of the amplifier circuit in a digital fashion,
   wherein the gain control circuit comprises:
   a first digital gain modulation circuit operable to generate a first gain control signal for modulating the gain at a first rate or a second rate;
   a second digital gain modulation circuit operable to generate a second gain control signal for modulating the gain at a third rate or a fourth rate; and
   a selection circuit operable to select one of the first and second gain control signals as the gain control signal based on a predetermined criteria.

2. The amplifier of claim 1, wherein the comparator circuit is operable to compare the output signal to a predetermined threshold and wherein a state of the first control signal is a function of the comparison.

3. The amplifier of claim 1, wherein the first digital gain modulation circuit comprises:
   a first multiplexer operable to pass a first frequency signal or a second frequency signal to an output thereof based on the first control signal of the comparator circuit; and
   a first shift register operable to shift digital data of a first state in a first direction at the first frequency when the first control signal indicates the gain of the amplifier circuit is too high, and shift digital data of a second state in a second direction at the second frequency when the first control signal indicates the gain is not too high.

4. The amplifier of claim 3, wherein the first register comprises a multi-bit parallel output, and wherein a state of the multi-bit parallel output comprises a first digital word having a value indicative of a modulated gain of the amplifier circuit.

5. The amplifier of claim 4, wherein the second digital gain modulation circuit comprises:
   a second multiplexer operable to pass a third frequency signal or a fourth frequency signal to an output thereof based on a second control signal, wherein the second control signal is a function of the first digital word value; and
   a second shift register operable to shift digital data of a first state in a first direction at the third frequency when the second control signal indicates the gain of the amplifier circuit is too high, and shift digital data of a second state in a second direction at the fourth frequency when the second control signal indicates the gain is not too high.

6. The amplifier of claim 5, wherein the digital gain control circuit further comprises a first logic circuit operable to receive the first digital word from the first shift register and output the second control signal having a state which is a function of the first digital word value.

7. The amplifier of claim 6, wherein the first logic circuit outputs the second control signal at a state to shift digital data of the first state in the first direction when the first digital word value is greater than a fixed value.

8. The amplifier of claim 6, wherein the digital gain control circuit further comprises a second logic circuit operable to compare the first digital word from the first shift register to a second digital word comprising a multi-bit parallel output from the second shift register, and output the digital gain control signal in response thereto.

9. The amplifier of claim 1, wherein the comparator circuit comprises:
   an upper threshold comparator circuit operable to alter an output state thereof when the input signal or the output signal of the amplifier circuit exceed an upper threshold value; and
   a lower threshold comparator circuit operable to alter an output state thereof when the input signal or output signal of the amplifier circuit fails below a lower threshold value.

10. The amplifier circuit of claim 9, further comprising a fourth logic circuit operable to enable the first digital gain modulation circuit when the upper threshold comparator circuit indicates the upper threshold value was exceeded or when the input signal or the output signal falls below the lower threshold value.

11. The amplifier circuit of claim 10, further comprising a delay circuit coupled between the lower threshold comparator and the fourth logic circuit, and operable to delay a signal transmitted therebetween.

12. The amplifier circuit of claim 10, wherein the first digital gain modulation circuit comprises:

a first multiplexer operable to pass a first frequency signal or a second frequency signal to an output thereof based on the first control signal of the comparator circuit; and a first shift register operable to be enabled or disabled based on an enable control signal from the fourth logic circuit, and further operable to shift digital data of a first state in a first direction at the first frequency when the first control signal indicates the upper threshold value has been exceeded, and shift digital data of a second state in a second direction at the second frequency when the first control signal indicates the output signal of the amplifier has fallen below the lower threshold value.

13. The amplifier of claim 12, wherein the first register comprises a multi-bit parallel output, and wherein a state of the multi-bit parallel output comprises a first digital word having a value indicative of a modulated gain of the amplifier circuit.

14. The amplifier of claim 13, wherein the second digital gain modulation circuit comprises:

a second multiplexer operable to pass a third frequency signal or a fourth frequency signal to an output thereof based on a second control signal, wherein the second control signal is a function of the first digital word value; and a second shift register operable to shift digital data of a first state in the first direction at the third frequency when the second control signal indicates the gain of the amplifier circuit is too high, and shift digital data of a second state in the second direction at the fourth frequency when the second control signal indicates the gain is not too high.

15. The amplifier of claim 14, wherein the digital gain control circuit further comprises a third logic circuit operable to compare the first digital word from the first shift register to a second digital word comprising a multi-bit parallel output from the second shift register, and output the second control signal having a state which is a function of the comparison.

16. The amplifier of claim 15, wherein the third logic circuit is further operable to disable the second shift register when a value of the first and second digital words are equal.

17. The amplifier of claim 16, wherein the third logic circuit is further operable to generate the second control signal having a state which is a function of a comparison between the first and second digital word values.

18. A method of digitally controlling a pain associated with an amplifier circuit, comprising:

comparing an output signal to a threshold; and modulating the cain in a digital fashion, wherein the gain is modulated up in a plurality of rates or down in a plurality of rates in response to the comparison, wherein modulating the gain comprises:

shifting digital data of a first state in a first direction of a first shift register at a first rate when the output signal exceeds the threshold, wherein the gain modulation rate is a function of the first shift rate; and shifting digital data of a second state in a second direction of the first shift register at a second rate when the output signal falls below the threshold, wherein the gain modulation rate is a function of the second shift rate.

19. The method of claim 18, wherein modulating the gain further comprises:

shifting digital data of the first state in the first direction of a second shift register at a third rate when a multi-bit digital word output of the first register exceeds a fixed value; and otherwise shifting digital data of the second state in said second direction of the second shift register at a fourth rate.

20. The method of claim 19, wherein modulating the gain further comprises:

comparing a multi-bit digital word output of the second shift register with the multi-bit digital word of the first shift register; and selecting one of the multi-bit digital word outputs as a digital gain control signal for modulating the gain based on the comparison.

21. The method of claim 18, wherein modulating the gain further comprises:

shifting digital data of the first state in the first direction of a second shift register at a third rate when a multi-bit digital word output of the first register exceeds a multi-bit digital word output of the second shift register; and otherwise shifting digital data of the second state in the second direction of the second shift register at a fourth rate.

22. The method of claim 18, wherein modulating the gain further comprises:

disabling a second shift register if a multi-bit digital word output of the first shift register and a second shift register are equal;

shifting digital data of the first state in the first direction of the second shift register at a third rate when the multi-bit digital word output of the first register exceeds the multi-bit digital word output of the second shift register; and otherwise shifting digital data of the second state in the second direction of the second shift register at a fourth rate.

23. The method of claim 18, wherein comparing the output signal to a threshold comprises:

comparing the output signal to an upper threshold; and comparing the output signal to a lower threshold which is less than the upper threshold.

24. The method of claim 18, wherein shifting digital data of the second state in the second direction is delayed a predetermined period of time after the output signal fails below the threshold.

25. The amplifier of claim 1, wherein a minimum value of the digital gain control signal is selected from one of a plurality of values.

26. The amplifier of claim 1, wherein a maximum value of the digital gain control signal is selected from one of a plurality of values.

* * * * *